US 8,098,537 B2
Jan. 17, 2012

(12) United States Patent
Mokhlesi

(54) DATA REFRESH FOR NON-VOLATILE STORAGE

(75) Inventor: Nima Mokhlesi, Los Gatos, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/903,067

(22) Filed: Oct. 12, 2010

(65) Prior Publication Data

US 2011/0026353 A1    Feb. 3, 2011

Related U.S. Application Data

(63) Continuation of application No. 12/338,879, filed on Dec. 18, 2008, now Pat. No. 7,859,932.

(51) Int. Cl.
*G11C 7/00* (2006.01)

(52) U.S. Cl. .............. 365/222; 365/189.14; 365/210; 365/230.03

(58) Field of Classification Search .......... 365/222, 365/189.14, 230.03, 210
See application file for complete search history.

(56) References Cited

U.S. PATENT DOCUMENTS

| | | | |
|---|---|---|---|
| 5,852,582 A | 12/1998 | Cleveland et al. | |
| 5,896,318 A | 4/1999 | Asada et al. | |
| 5,909,449 A | 6/1999 | So et al. | |
| 5,963,473 A | 10/1999 | Norman | |
| 6,151,246 A | 11/2000 | So et al. | |
| 6,226,200 B1 | 5/2001 | Eguchi et al. | |
| 6,307,776 B1 | 10/2001 | So et al. | |
| 6,415,352 B1 | 7/2002 | Asami et al. | |
| 6,636,937 B2 | 10/2003 | Peter | |
| 6,668,303 B2 | 12/2003 | Pio | |
| 6,834,022 B2 * | 12/2004 | Derner et al. | 365/222 |
| 6,847,570 B2 * | 1/2005 | Fujioka et al. | 365/222 |
| 6,965,526 B2 | 11/2005 | Cavaleri et al. | |
| 7,012,835 B2 | 3/2006 | Gonzalez et al. | |
| 7,031,210 B2 | 4/2006 | Park et al. | |
| 7,170,781 B2 | 1/2007 | So et al. | |
| 7,173,852 B2 | 2/2007 | Gorobets et al. | |
| 7,193,919 B2 | 3/2007 | Hoehler | |

(Continued)

OTHER PUBLICATIONS

International Search Report & The Written Opinion of the International Searching Authority dated Mar. 3, 2010 in International Application No. PCT/US2009/058969.
Notice of Allowance and Fee(s) Due dated Aug. 23, 2010 in U.S. Appl. No. 12/338,879.

*Primary Examiner* — Son Dinh
(74) *Attorney, Agent, or Firm* — Vierra Magen Marcus & DeNiro LLP

(57) ABSTRACT

Techniques are disclosed to refresh data in a non-volatile storage device often enough to combat erroneous or corrupted data bits, but not so often as to interfere with memory access or to cause excessive stress on the memory cells. One embodiment includes determining to perform a refresh of data stored in a first group of non-volatile storage elements in a device based on a condition of data in the first group, determining that a second group of non-volatile storage elements in the device should undergo a refresh procedure based on when the second group of non-volatile storage elements were last programmed relative to when the first group of non-volatile storage elements were last programmed, and performing the refresh procedure on the second group of non-volatile storage element.

25 Claims, 15 Drawing Sheets

U.S. PATENT DOCUMENTS

| | | |
|---|---|---|
| 7,224,607 B2 | 5/2007 | Gonzalez et al. |
| 7,349,277 B2 | 3/2008 | Kinsley et al. |
| 7,362,641 B2 | 4/2008 | Morgan et al. |
| 7,859,932 B2 * | 12/2010 | Mokhlesi ...................... 365/222 |
| 2007/0104004 A1 | 5/2007 | So et al. |
| 2008/0055990 A1 | 3/2008 | Ishikawa et al. |

* cited by examiner

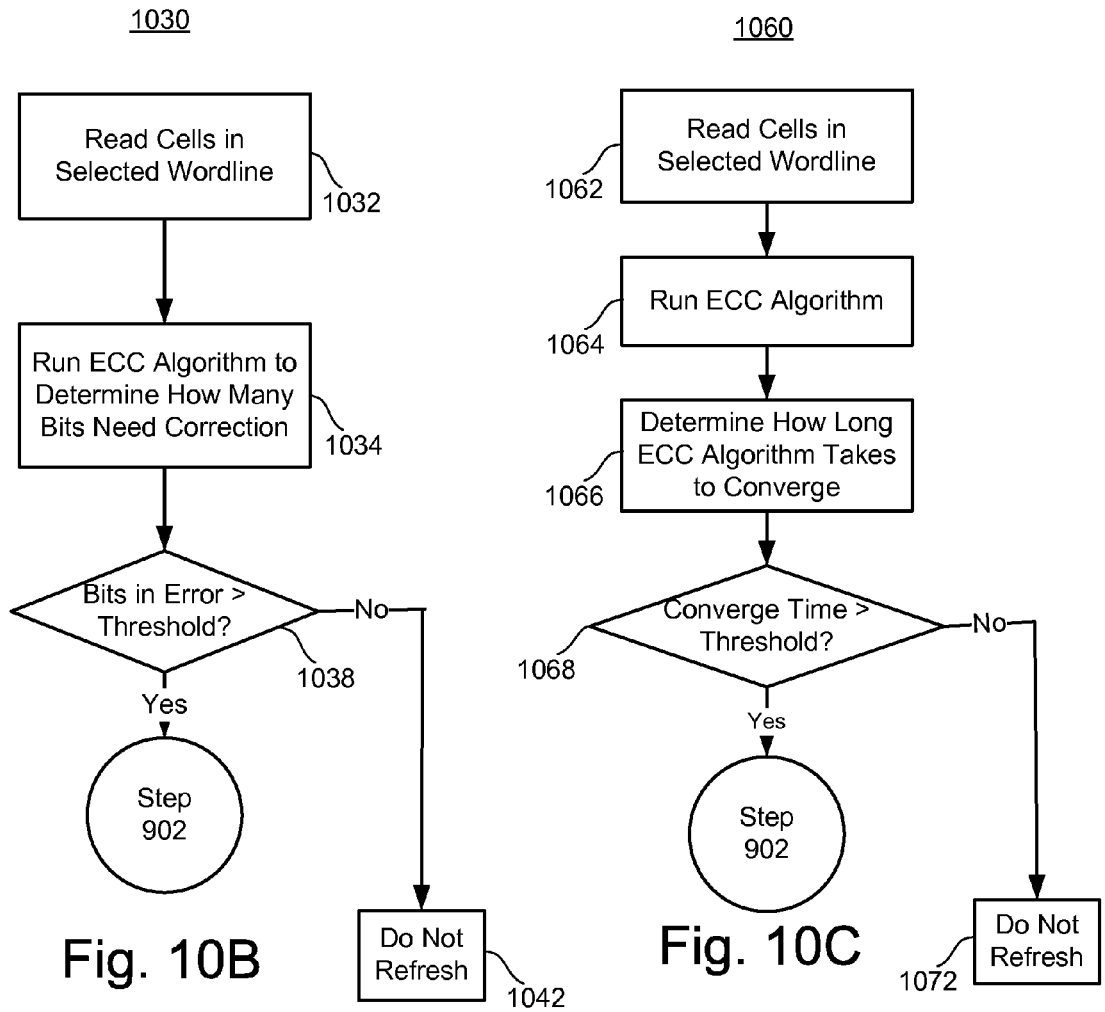

|  | S0 | S1 | S2 | S3 | S4 | S5 | S6 | S7 | S8 | S9 | S10 | S11 | S12 | S13 | S14 | S15 |
|---|----|----|----|----|----|----|----|----|----|----|-----|-----|-----|-----|-----|-----|
| WL1-10 |  |  |  |  |  |  |  |  |  |  |  |  |  |  |  |  |
| WL11-23 |  |  |  |  |  |  |  |  |  |  |  |  |  | Vx |  |  |
| WL24-40 |  |  |  |  |  |  |  |  |  |  |  |  |  |  |  |  |
| WL41-53 |  |  |  |  |  |  |  |  |  |  |  |  |  |  |  |  |
| WL54-63 |  |  |  |  |  |  |  |  |  |  |  |  |  |  |  |  |

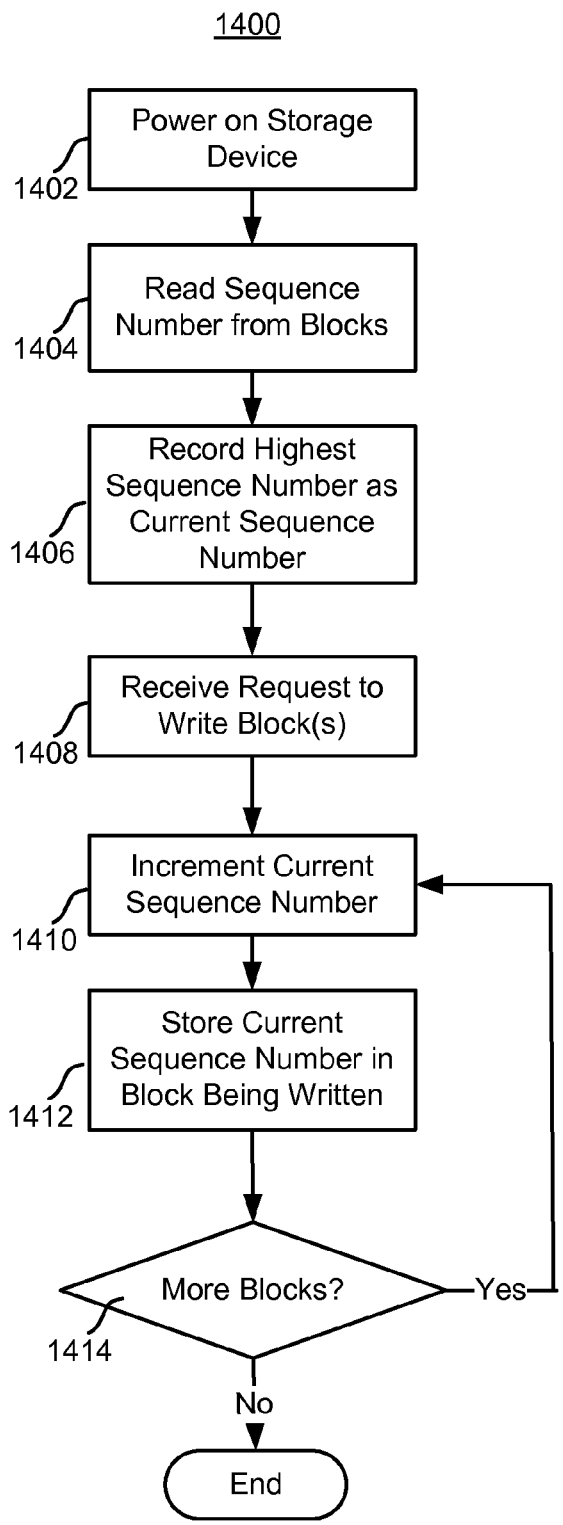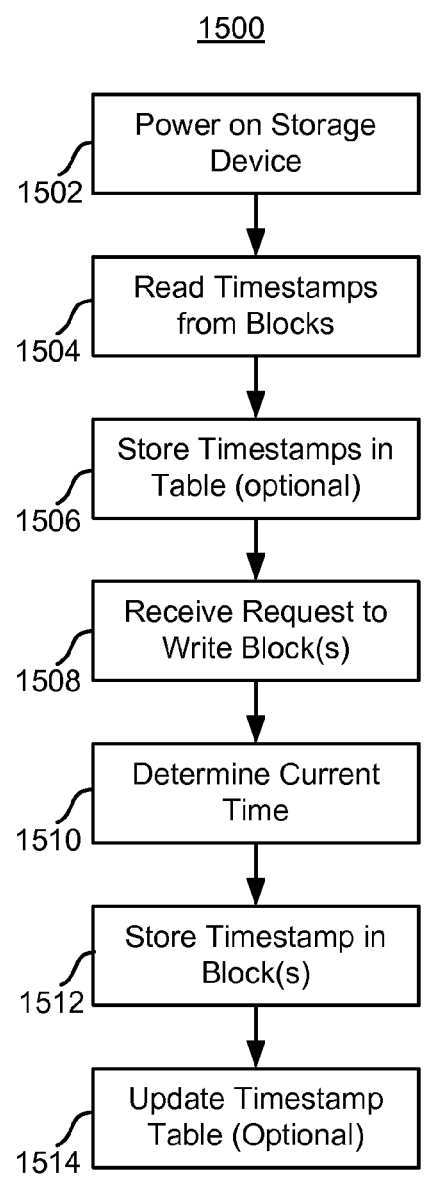
Fig. 14
Fig. 15

DATA REFRESH FOR NON-VOLATILE STORAGE

CLAIM OF PRIORITY

This application is a continuation of U.S. patent application Ser. No. 12/338,879 filed Dec. 18, 2008, now U.S. Pat. No. 7,859,932, entitled "DATA REFRESH FOR NON-VOLATILE STORAGE", which application is incorporated herein by reference in its entirety.

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing at each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

Some EEPROM and flash memory devices have a floating gate that is used to store two ranges of charges and, therefore, the memory cell can be programmed/erased between two states (an erased state and a programmed state). Such a flash memory device is sometimes referred to as a binary memory device.

A multi-state memory device stores multiple bits of data per memory cell by identifying multiple distinct valid threshold voltage (Vt) distributions (or data states). Each distinct Vt distribution corresponds to a predetermined value for the set of data bits encoded in the memory device. For example, a memory cell that stores two bits of data uses four valid Vt distributions. A memory cell that stores three bits of data uses eight valid Vt distributions.

Once a non-volatile storage element has been programmed, it is important that its programming state can be read back with a high degree of reliability. However, the sensed programming state can sometimes vary from the intended programming state due to factors including noise and the tendency of devices to gravitate towards charge neutrality over time. Note that environmental factors, such as temperature affect the rate at which programming states change. For example, exposure to high temperature may cause the memory cells to gravitate towards charge neutrality very quickly.

Consequently, it is possible to encounter erroneous or corrupted data bits at the time of reading non-volatile memory. Typically, some form of error checking and correction algorithm ("correction algorithm") is applied to check for and correct any corrupted data bits. One common correction algorithm stores additional parity bits to set the parity of a group of data bits to a required logical level during the write process. The additional parity bits are sometimes referred to as an Error Correction Code (ECC). During the read process, the correction algorithm decodes the bits by computing the parity of the group of data bits to detect any corrupted data. The correction algorithm corrects data that is not too severely corrupted. In some implementations, the more corrupted the data is, the longer the correction algorithm takes to correct the data.

To prevent the data from becoming corrupted, the data in the memory cells may be refreshed, which returns the data to the desired threshold voltages. Refreshing the data in a block of memory cells is often achieved by reading the data, correcting any errors detected by the correction algorithm, and writing the data to a different block as part of scheme that includes wear leveling. However, the data could be rewritten to the same block, if desired. Undesirably, refreshing the data too frequently can overstress the memory cells. Moreover, refreshing the data can interfere with the user's own memory accesses.

Thus, one the one hand, if the data are not refreshed often enough, data could be lost or memory access can be slow due to correction algorithms taking longer to correct the data. On the other hand, if the data are refreshed too often, the memory device may be overstressed or user memory access may be hindered.

Moreover, determining when to refresh the data is especially challenging when the memory device could be subjected to varied environmental conditions such as a wide range of temperatures. For example, the memory device could be embedded in a personal navigation device, which might be left in a parked automobile. During a summer day, the temperature inside the automobile can rise to an extremely high temperature. On the other hand, the memory device might go long stretches of time without being subjected to high temperatures. Therefore, it can be extremely difficult to predict the effect that environmental conditions such as temperature will have on data retention.

SUMMARY OF THE INVENTION

Techniques are disclosed herein to refresh data in a non-volatile storage device often enough to combat erroneous or corrupted data bits, but not so often as to interfere with memory access or to cause excessive stress on the memory cells. The techniques are well suited to memory devices that could be subjected to varied environmental conditions such as a wide range of temperatures.

One embodiment includes determining to perform a refresh of data stored in a first group of non-volatile storage elements in a device based on a condition of data in the first group, determining that a second group of non-volatile storage elements in the device should undergo a refresh procedure based on when the second group of non-volatile storage elements were last programmed relative to when the first group of non-volatile storage elements were last programmed, and performing the refresh procedure on the second group of non-volatile storage elements.

One embodiment includes writing data to a set of multi-state non-volatile storage elements, determining whether data stored in a first group of non-volatile storage elements in the set should be refreshed based on a condition of one or more of the non-volatile storage elements in the first group, determining which non-volatile storage elements in the set were written prior to the first group of non-volatile storage elements if it is determined that data stored in the first group should be refreshed, and determining that the non-volatile storage elements that were written prior to the first group should undergo a refresh procedure.

One embodiment is a method for operating a multi-state memory device that is organized into blocks of non-volatile storage elements. The method comprises determining that there is a data integrity problem with one or more non-volatile storage elements in a first of the blocks, determining which of the blocks in the device were written prior to the first block, and refreshing data stored in the first block and the blocks that were written prior to the first block without determining whether there is a data integrity problem with non-volatile storage elements in the blocks that were written prior to the first block.

One example implementation includes a set of non-volatile storage elements and one or more managing circuits in communication with the set of non-volatile storage elements. The one or more managing circuits perform the processes described above.

BRIEF DESCRIPTION OF THE DRAWINGS

FIG. 10B depicts one embodiment of a process of determining whether a data refresh is needed based on how many bits need to be corrected by a correction algorithm.
FIG. 10C depicts one embodiment of a process of determining whether a data refresh is needed based on how long a correction algorithm takes to converge.
FIG. 12 depicts one embodiment of a table that stores values for determining whether a data refresh is needed.
FIG. 14 depicts one embodiment of a process of managing sequence numbers that are used to identify candidate blocks for a refresh procedure.
FIG. 15 depicts one embodiment of a process of managing time stamps that are used to select candidate blocks for a refresh procedure.

DETAILED DESCRIPTION

Figure 1:
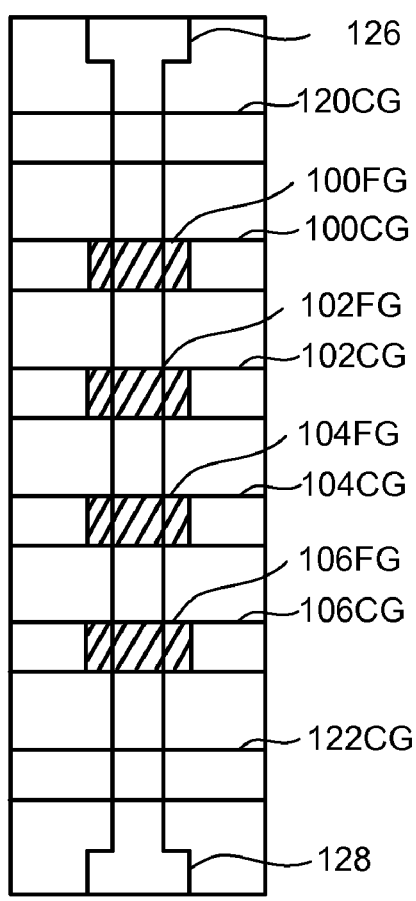
FIG. 1 is a top view of a NAND string.
Figure 2:
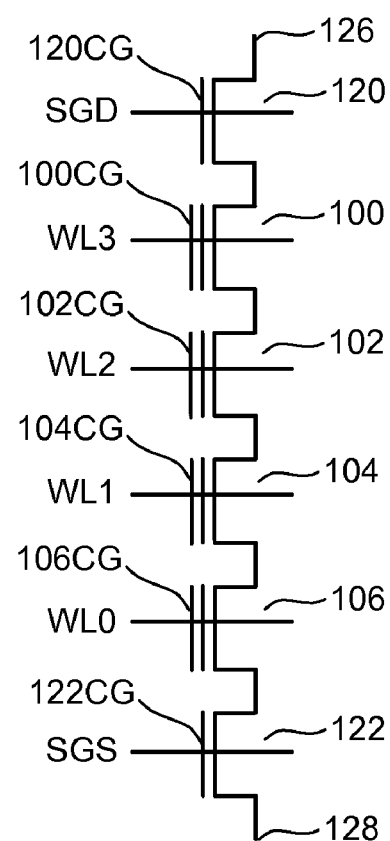
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
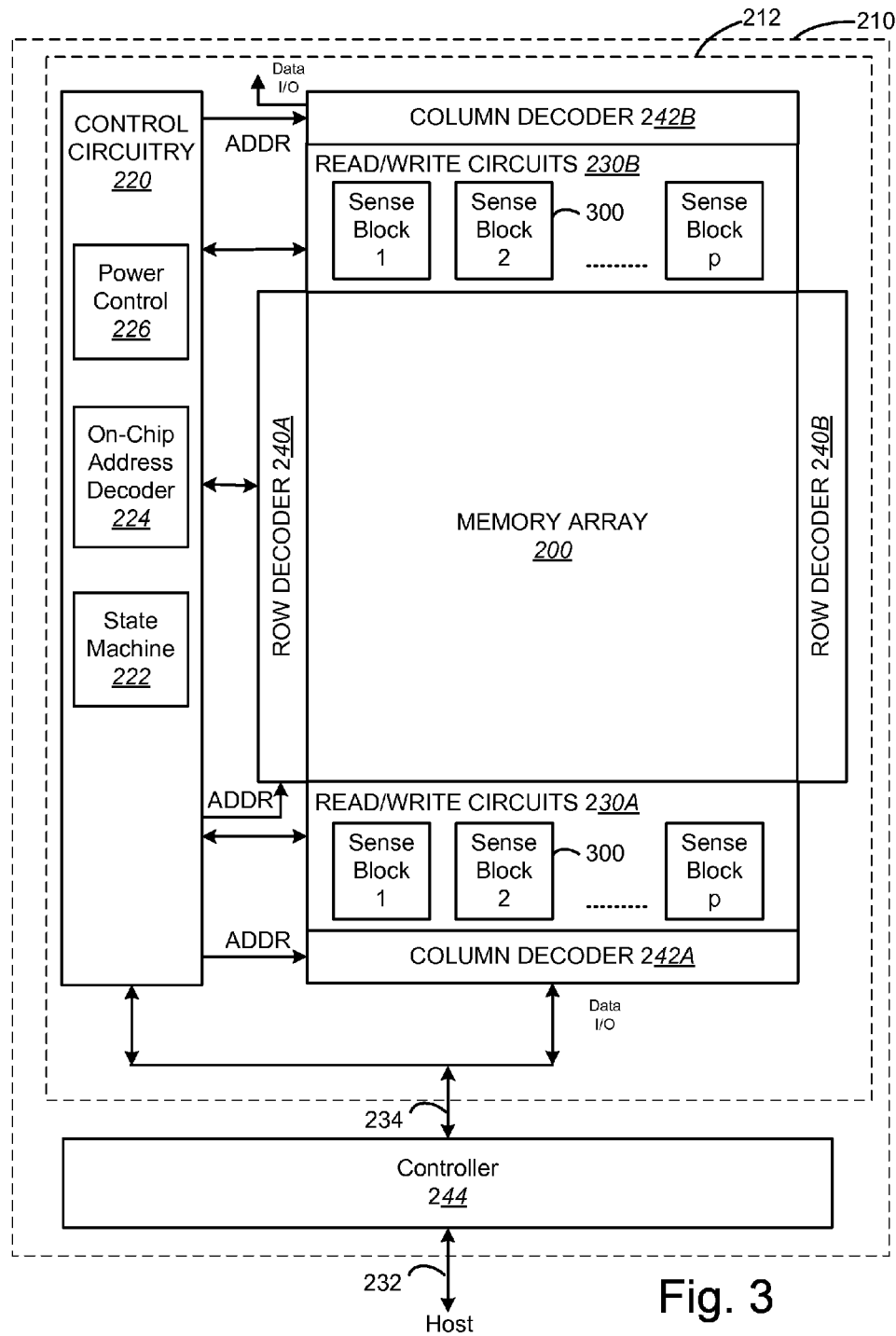
FIG. 3 is a block diagram of a non-volatile memory system.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
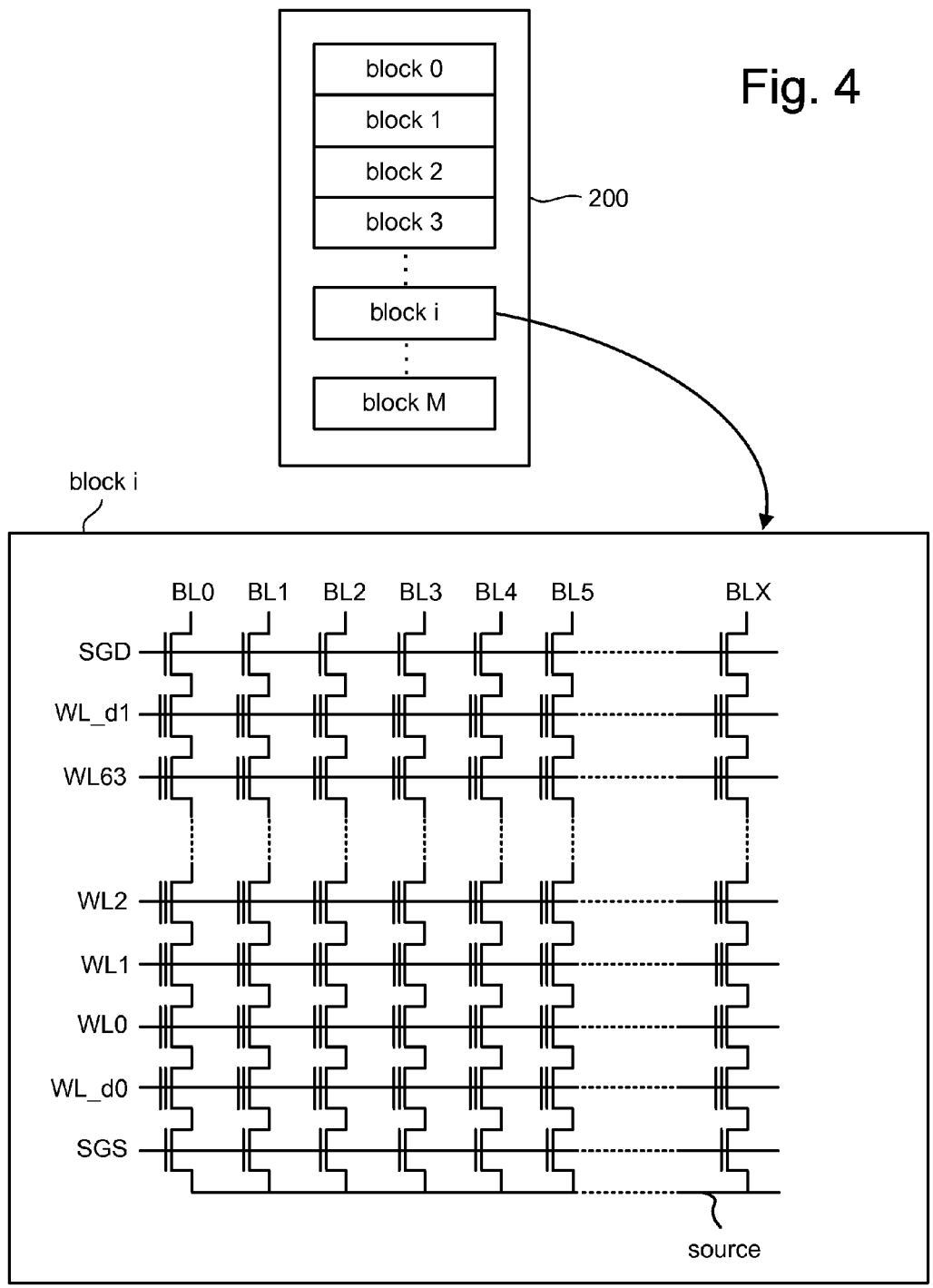
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data. Some embodiments do not include dummy memory cells.

Figure 5:
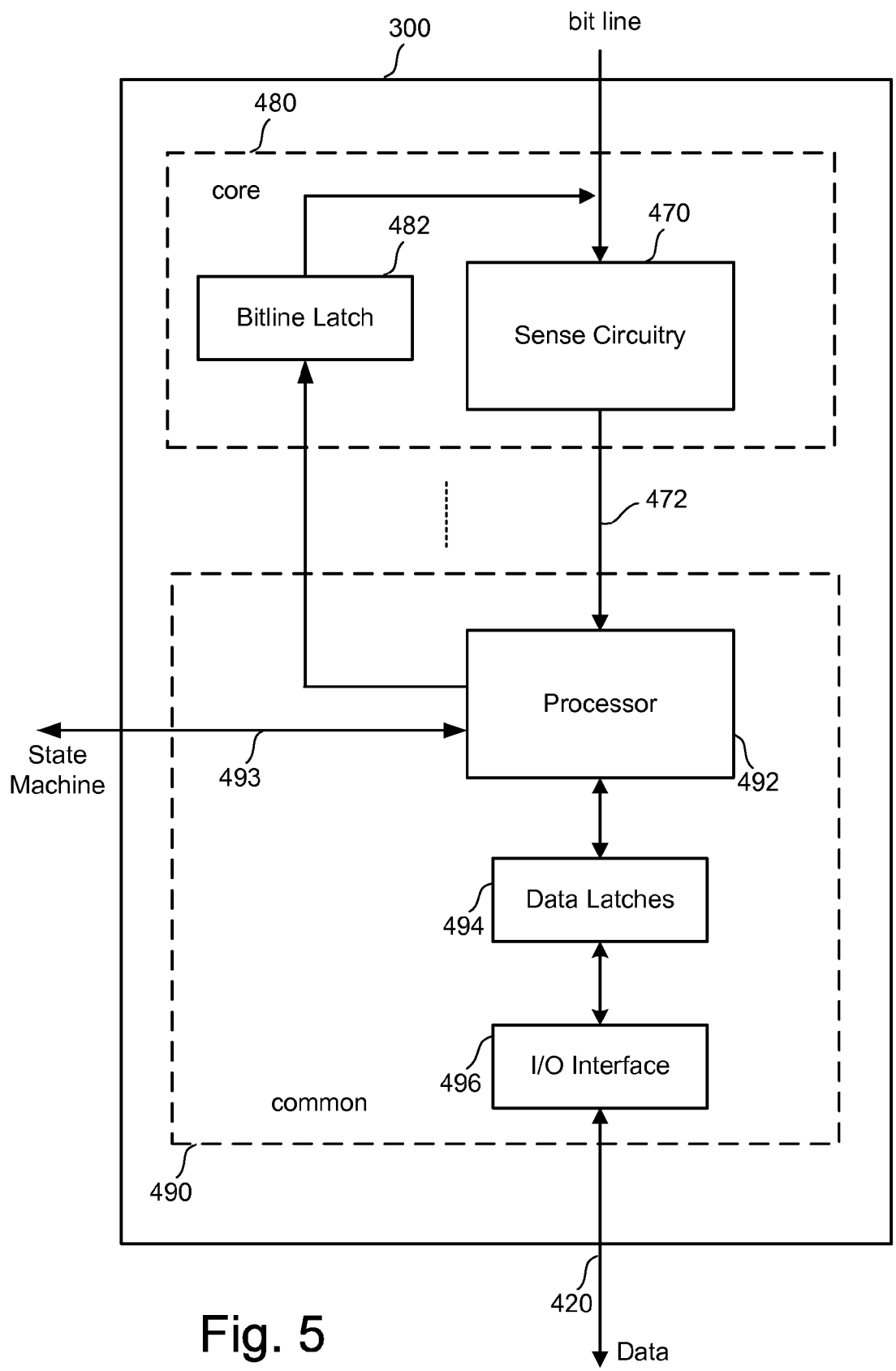
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Figure 6A:
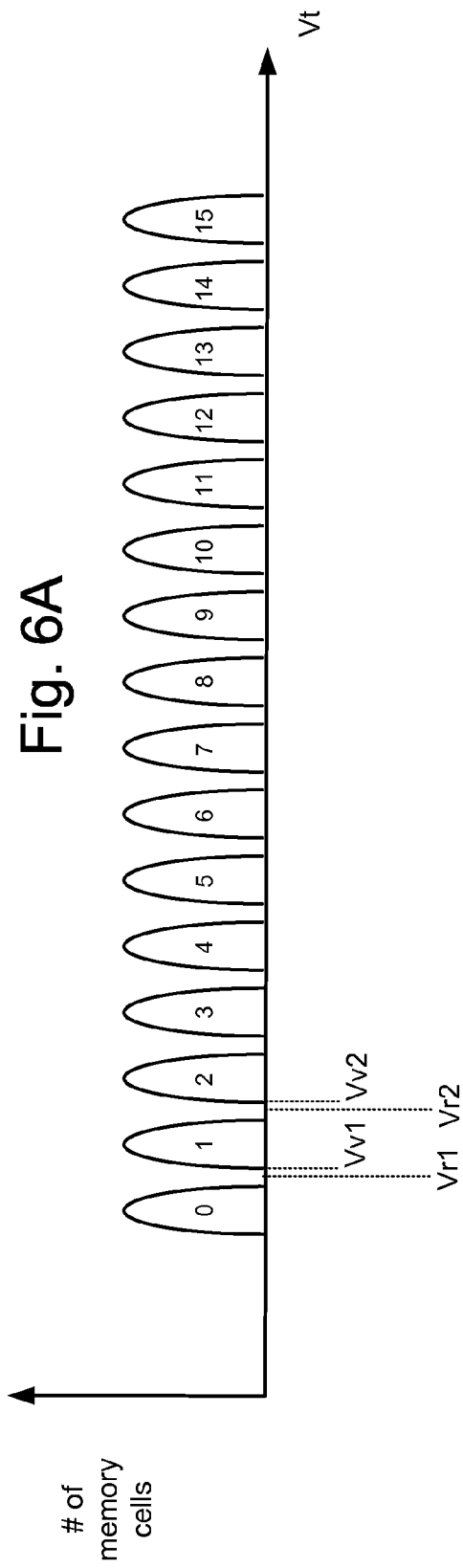
FIG. 6A depicts an example set of Vt distributions.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores four bits of data. Other embodiment, however, may use more or less than four bits of data per memory cell. FIG. 6A shows 16 Vt distributions corresponding to data states 0-15. In one embodiment, the threshold voltages in state 0 are negative and the threshold voltages in the states 1-15 are positive. However, the threshold voltages in one or more of states 1-15 may be negative.

Between each of the data states 0-15 are read reference voltages used for reading data from memory cells. For example, FIG. 6A shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6A shows Vv1 for state 1 and Vv2 for state 2. When programming memory cells to a given state, the system will test whether those memory cells have a threshold voltage greater than or equal to the verify reference voltage.

Figure 6B:
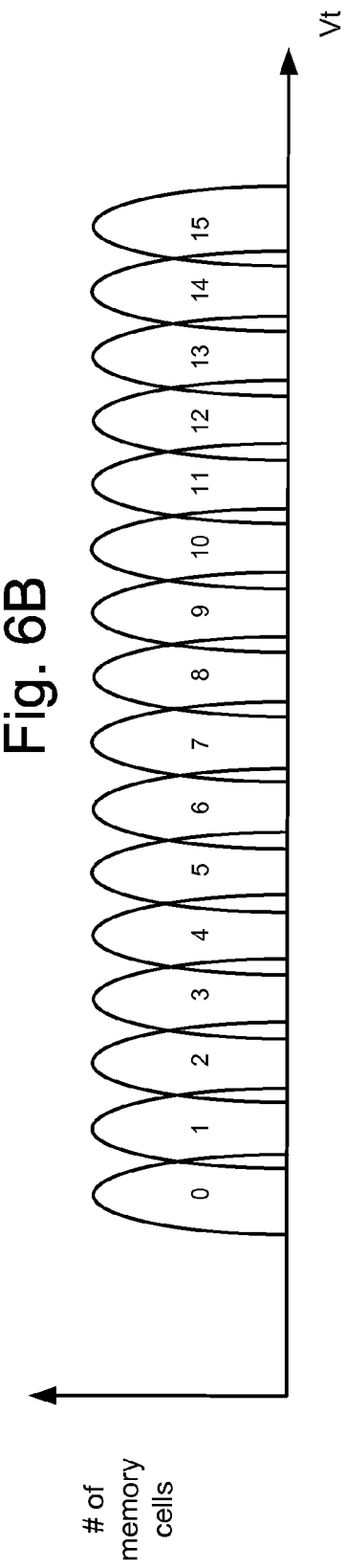
FIG. 6B depicts an example set of Vt distributions.

FIG. 6B illustrates that another embodiment of Vt distributions corresponding to data states 0-15 can partially overlap since the correction algorithm can handle a certain percentage of cells that are in error.

Also note that the Vt axis may be offset from actual voltages applied to the control gates as body effect through source or body biasing is used to shift negative threshold voltage into the measurable positive range. Another point to note is that contrary to the equal spacing/width of the depicted sixteen states, various states may have different widths/spacings in order to accommodate varying amounts of susceptibility to data retention loss. In some embodiments, states 0 and/or 15 are wider than the other states.

Figure 7:
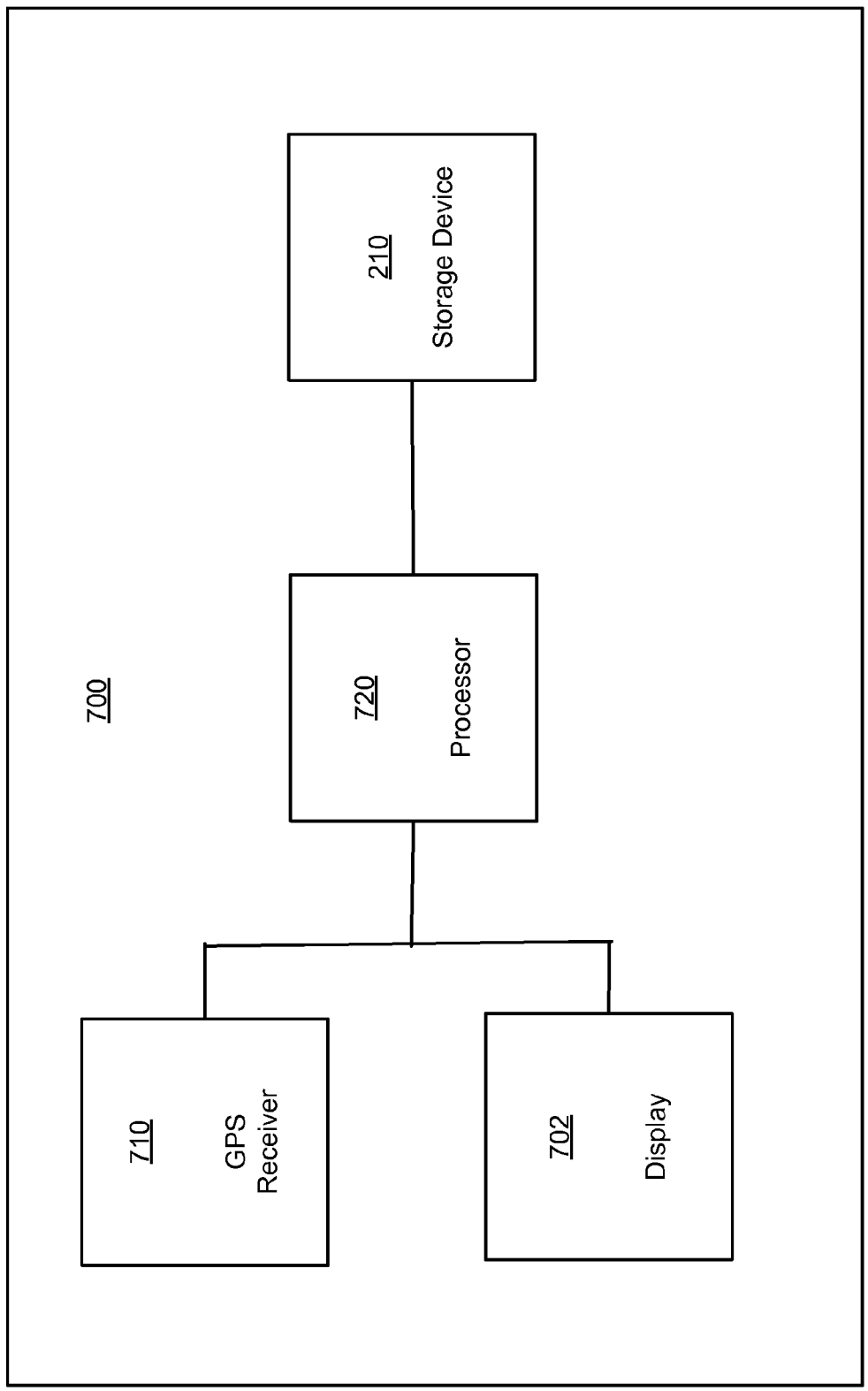
FIG. 7 is an example mobile device in which a storage device in accordance with embodiments of the present invention may be embedded.

FIG. 7 depicts an exemplary mobile device 700 in which a storage device 210 in accordance with embodiments of the present invention is embedded. The exemplary device 700 has a global positioning satellite (GPS) receiver 710 for receiving GPS information such that it may be used as a personal navigation device. The storage device 210 may be used to store maps, which the processor 720 displays to the user on the display 702 based on the device's position as determined by the GPS information.

Typically, once the user has stored a set of maps in the storage device 210, the user does not need to write over the stored maps for an extended time period. For example, the majority of the map data may go unchanged for several years. Embodiments disclosed herein determine how often to refresh data, such as the map data, that is often enough to protect the data but not so often as to interfere with the user or overstress the storage device 210. The exemplary device 700 is used as one example of a device with an embedded storage device 210. However, the embedded storage device 210 can be used with personal digital assistants, cellular telephones, personal media players, etc.

Figure 8:
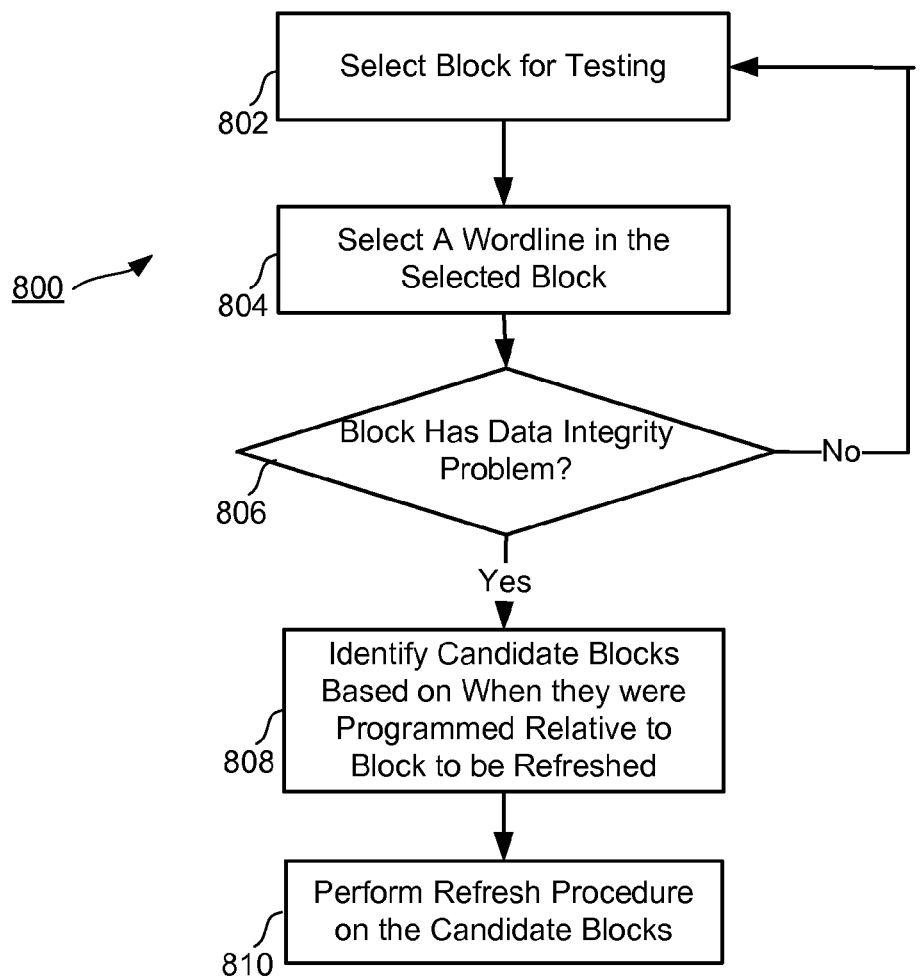
FIG. 8 depicts one embodiment of a process of determining which blocks should have data refreshed.

FIG. 8 depicts one embodiment of a process 800 of determining which blocks in the storage device 210 should have their data refreshed. Typically, process 800 is used for blocks in which more than a single bit is stored per memory cell such as the examples of FIGS. 6A and 6B of storing four bits per cell. Process 800 can be initiated as soon as there is idle time after the storage device 210 is powered on and at periodic intervals thereafter. In one embodiment, the storage device 210 is incorporated into a portable device (e.g., personal navigation device) that may have access to power for extended periods of time even if the portable device itself is powered down. For example, a personal navigation device might stay plugged into an automobile's cigarette lighter for many days at a time, in which case process 800 can be performed periodically. In one embodiment, process 800 is triggered based on performance of a correction algorithm. For example, if a correction algorithm is taking too long to converge or if the number of data bits that need to be corrected by the correction algorithm is larger than a critical value, then process 800 is initiated to determine whether particular blocks (those associated with the detected problem or others) should have their data refreshed.

In step 802, a block of the memory array 200 is selected for testing for a data integrity problem such as a data retention problem, a read disturb problem, etc. However, it is not required that the cause (e.g., data retention) of the data integrity problem be specifically identified. In one embodiment, blocks in the memory array 200 are tested sequentially to ensure that each block is tested. However, the blocks could be tested in a different order such as a random order or the order in which blocks were last programmed. It is not required that process 800 test every block in the memory array 200. For example, testing can be deferred on blocks that have been recently programmed. However, because the history of the temperature is difficult to monitor and record, the effect on data integrity problems can be difficult to predict. For example, it can be difficult to directly determine whether the storage device 210 was exposed to high temperatures. For example, the storage device 210 may be left in a hot environment without any power source to drive logic that could monitor and store temperature data. As a result, even blocks that were recently programmed can be tested to avoid missing data integrity problems.

In one embodiment, process 800 only selects a small sample of blocks in the memory array 200 for testing. In one embodiment, only blocks that store a certain minimum number of bits per memory cell are tested for a data integrity problem. For example, some blocks might store a single bit per memory cell and others four bits per cell. In such a case, the blocks storing a single bit per memory cell have a very large gap between the Vt distributions and need not be tested.

In some embodiments, the system guarantees that an entire block of data is written at essentially the same time, in which case, it is not required that each word line in the selected block be analyzed for a data integrity problem. By writing at essentially the same time it is meant that the system enforces a rule that if the writing of the block is interrupted, then the write to the block is aborted. That is, the data in the block is discarded and the data is written to another block at a later time. Note that writing at essentially the same time does not mean that all word lines are programmed simultaneously. Typically, the word lines are programmed sequentially.

An example of writing an entire block at essentially the same time is to store data temporarily in blocks in which each memory cell stores a single bit ("binary blocks"). Then, after four such binary blocks are filled, the data is written to a block in which each memory cell stores four bits (herein referred to as an "X4 block"). If the writing of the data to the X4 block is interrupted, then the write to that X4 block is aborted. At a later time, the data that is still in the binary blocks is written to another X4 block. If that write completes without interruption, the block write is successful. Thus, all the data in the X4 block is written at essentially the same time.

In step 804, one word line in the selected block is selected for data integrity analysis. In some embodiments, the system guarantees that word lines are written in the some particular order. In an embodiment in which word lines are written in a particular order, the first word line in the block that was written is selected for data integrity analysis. In one embodiment, the selection of the word line is made randomly. If desired, multiple worldines in the block can be analyzed for data integrity. Not all word lines in the block need to be candidates for the selection. In one embodiment, a word line that is known to be more problematic than others can be selected for data integrity analysis. For example, engineering characterization may already have determined that the first word line in each block has a stronger susceptibility to data integrity problem. In other embodiments, word lines near the edge of the block may be kept out of the candidate pool because word lines near the middle of a block might be more suitable if testing a single word line per block.

While in one embodiment of process 800 a word line is randomly selected, it is not required that the word line be randomly selected. In one embodiment, a record is kept of the word line(s) that are tested so that each word line (or at least each of a candidate set) is tested. For example, testing of the word lines can proceed sequentially with a different word line tested each time the block is tested.

Figure 10A:
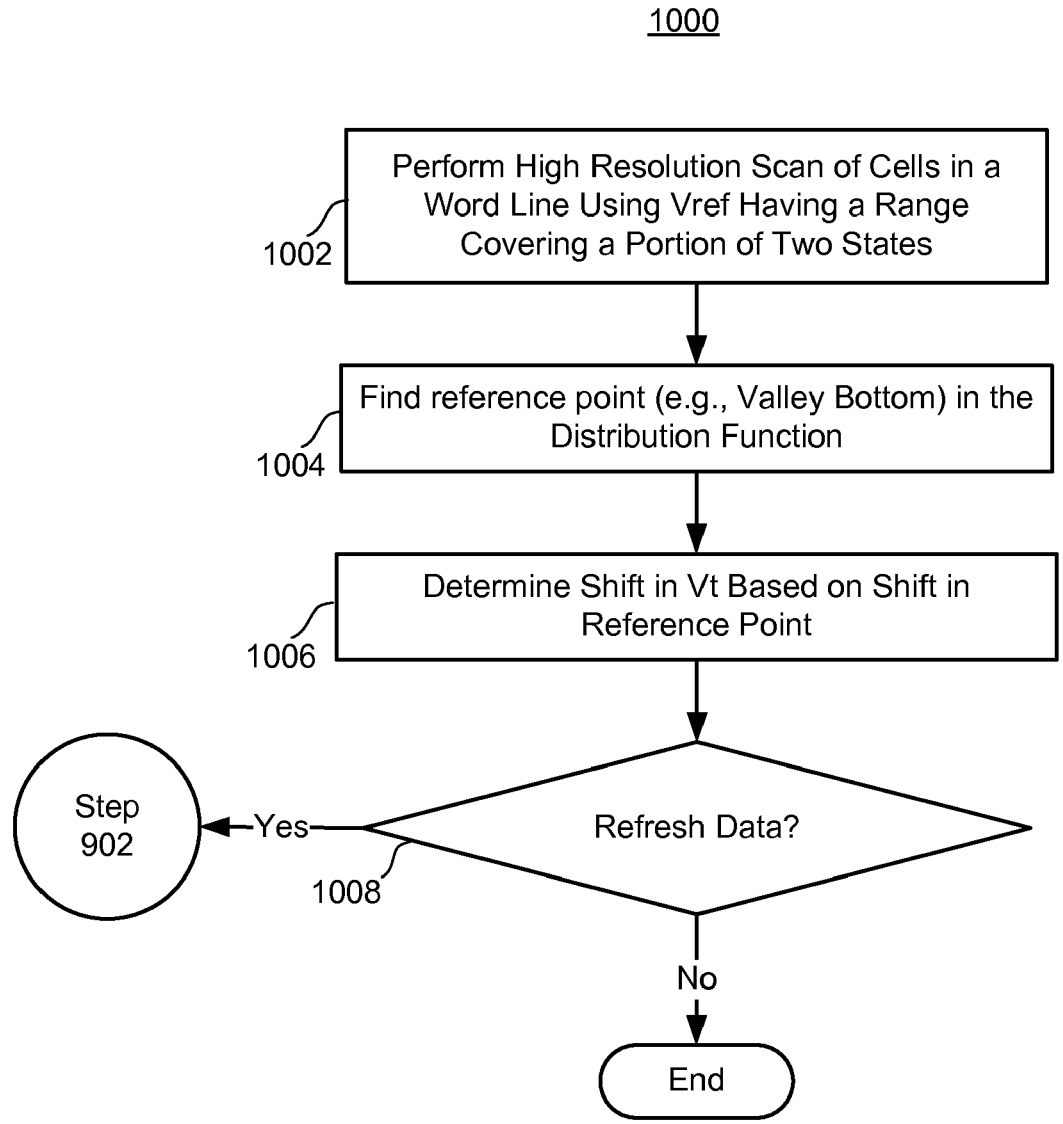
FIG. 10A is a flowchart depicting one embodiment of a process of determining whether there is a data integrity problem with a block.

In step 806, a determination is made as to whether data stored in the selected word line of the block has a data integrity problem that indicates that the block should be refreshed. FIGS. 10A, 10B, and 10C provide details of several techniques that can be used to determine whether there is a data integrity problem. Briefly, one technique involves determining whether one or more Vt distributions in the block have shifted by more than a permitted amount, which can indicate that there is a data retention problem. Such a shift might also indicate another problem such as read disturb. Testing for this shift does not require that all Vt distributions be analyzed for a shift.

Another technique to test for a data integrity problem involves running a correction algorithm on the data read from the word line in the selected block. A data integrity problem is indicated based on the number of bits that need to be corrected by the correction algorithm or by the length of time the correction algorithm takes to converge to a solution.

If the block does not have a data integrity problem, then control passes to step 802 to select another block for testing.

Figure 9A:
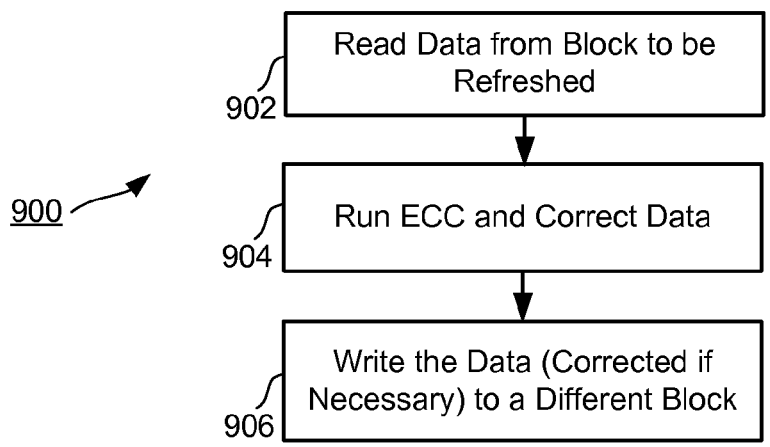
FIG. 9A is a flowchart illustrating one embodiment of a process of refreshing data that is stored in a block of the memory array.

If the selected block does have a data integrity problem, then a record of this is kept so that at some point data in the block can be refreshed. Note that the data is not necessarily refreshed immediately. For example, prior to performing the data refresh of any blocks, a determination can be made as to which set of blocks are to be refreshed. In some cases, the device may be powered down before the data refresh is performed. In one embodiment, a spare block is used to record which data blocks should be refreshed. FIG. 9A depicts a process of refreshing data.

Note that once one block has been identified as having a data integrity problem, it may be that many other blocks will also suffer from the same problem. For example, if the data integrity problem is due to the memory device having been exposed to high temperatures, then other blocks may also have the same data integrity problem. This may be especially true for other blocks that were last programmed prior to the block with the problem, or recently thereafter. Thus, these other blocks may be candidates for a refresh procedure. Therefore, if step 806 determined that the block does have a data integrity problem (hereafter referred to as a "bad block"), then control passes to step 808 to identify other blocks for a refresh procedure.

In step 808, blocks are identified for the refresh procedure based on when they were last programmed relative to when the bad block was last programmed. Herein, these other blocks will be referred to as "candidate blocks." For example, all of the blocks that were programmed prior to the bad block are identified as candidate blocks. However, blocks that were programmed within a certain time period after the bad block could also be identified as candidate blocks.

In step 810, a refresh procedure is performed on the candidate blocks. The refresh procedure determines whether data in the candidate blocks should be refreshed. In one embodiment, the refresh procedure automatically refreshes the data in the candidate blocks without determining whether there is a data integrity problem within the candidate blocks. In one such automatic data refresh embodiment, process 900 of FIG. 9A is used to implement step 810.

In one embodiment, the refresh procedure of step 810 determines whether there is a data integrity problem with the candidate block in order to determine whether to refresh the data in the candidate blocks. Any of the processes of FIGS. 10A, 10B, 10C, or another process can be used to determine whether there is a data integrity problem with a word line in the candidate block. In an embodiment where the entire block has been written at essentially the same time, the word line to be tested in the candidate block is randomly selected. If one of the processes of FIGS. 10A, 10B, 10C determines that there is a data integrity problem with the candidate block, then process 900 of FIG. 9A may be used to refresh the data in the candidate block.

Note that it is possible that the candidate block is tested for data integrity by step 806 during one iteration of process 800 and again tested for data integrity at step 810 of a different iteration of process 800. However, it is likely that a different randomly selected word line will be selected for testing at step 810 than the word line that was tested at step 806. Also, a different data integrity test can be used than was used in step 806. For example, at step 806 the test of FIG. 10B might have been used (determining how many bits need correction by a correction algorithm), whereas at step 810 the test of FIG. 10A might be used (looking for shift in Vt distribution). However the same test could be used but with different parameters. As an example, the number of bits in need of correction by the correction algorithm in order to trigger the data refresh could be different when testing the block for the second time.

By refreshing the data in the strategically identified candidate blocks, the process 800 refreshes data often enough to prevent data from being lost, but not so often as to overstress the device 210 or interfere with user access to the memory array 200. Note that some of the candidate blocks may have recently been tested for a data integrity problem in steps 802-806, but the test did not result in a determination to refresh the data. A possible reason for this is that the severity of the data integrity problem was not quite at the threshold to trigger the data refresh.

Note that by performing the refresh procedure on the candidate blocks based on when they were last programmed relative to when the bad block was last programmed, the blocks in the storage device 210 are refreshed at an appropriate time that is neither too frequent to overstress the device nor too infrequent such that data integrity problems could become too severe to correct by the correction algorithm.

As an example, consider the case in which the storage device 210 might be left in an extremely hot environment such as the interior of an automobile during summer. Subjecting the storage device 210 to such high temperatures can greatly accelerate the rate of charge loss/gain, which may potentially result in data retention problems. However, note that simply refreshing the data frequently may not be needed because the device will not necessarily be subjected to high temperature. Moreover, frequent data refreshing can be undesirable because it may overstress the device or interfere with normal use of the device.

FIG. 9A is a flowchart illustrating one embodiment of a process 900 of refreshing data that is stored in a block of the memory array 200. The process 900 is initiated on blocks that have been identified by either step 806 or step 810 of process 800 of needing a data refresh. In one embodiment, process 900 refreshes all of the pages in a block. However, it is not required that the data in all of the pages be refreshed. In step 902, data is read from the block to be refreshed. As previously discussed, when the data for the block was originally stored, parity check bits were computed on a sector by sector basis and combined with user data as part of the ECC encoding mechanism. Note that prior to storing the data, in order to randomize data, a scrambling procedure can be employed also. In some embodiments, the cells on one word line form several sectors or ECC pages. A sector's data may first be scrambled and then encoded by the ECC engine. The scrambled and ECC encoded data corresponding to several sectors can be accumulated and then written simultaneously to a single word line. For example, one word line may accommodate four sectors worth of data. In some architectures, all cells on one word line can be written simultaneously. The programming of one block consists of writing data to one word line at a time in each plane. An example of such a NAND architecture in which all bits lines can be programmed together (ABL NAND architecture) is described in United States Patent Application Pub. No. 2006/0158947.

In step 904, an ECC algorithm is run on the data just read to correct the data. In one embodiment, the controller 244 performs a strong error correction algorithm that is able to correct 6 or more bits per 512 bits. In one embodiment, the controller 244 performs an iterative decoding technique. In one embodiment, the controller 244 performs probabilistic error correction in a multi-bit-per-cell flash memory. Further details of performing error correction in a multi-bit-per-cell flash memory are provided in U.S. published patent application 2007/0086239, published on Apr. 19, 2007, titled "Probabilistic Error Correction in Multi-bit-per-cell Flash Memory;" and U.S. published patent application 2007/0089034, published on Apr. 19, 2007, titled "Method of Error Correction in MBC Flash Memory;" each of which is incorporated herein by reference.

In step 906, the corrected data is written to a block of the memory array 200. In one embodiment, the data is always written to a different block than the one being refreshed in order to achieve "wear leveling." That is, writing the data to a different block can help to even out how much programming that each block experiences. In one embodiment, a determination is made as to whether to refresh the data to a new block or the same block. This determination may be made based on the time since the last write of the block and/or a "hot count" of the number of times the block has been programmed. For example, if the block was recently programmed and/or if the hot count is high, it may be desirable to write the data to a different block. Each block stores its own hot count, in one embodiment.

In one embodiment, a message is displayed to the user not to power down the device until the refresh procedure 900 completes. However, regardless of whether such a message is displayed, the user could power down the device during data refresh. Also, the user might interrupt the refresh procedure by accessing the memory array 200. Thus, a record is kept in non-volatile memory of the progress of the data refresh process 900 such that the process 900 can be resumed if it is interrupted.

Figure 9B:
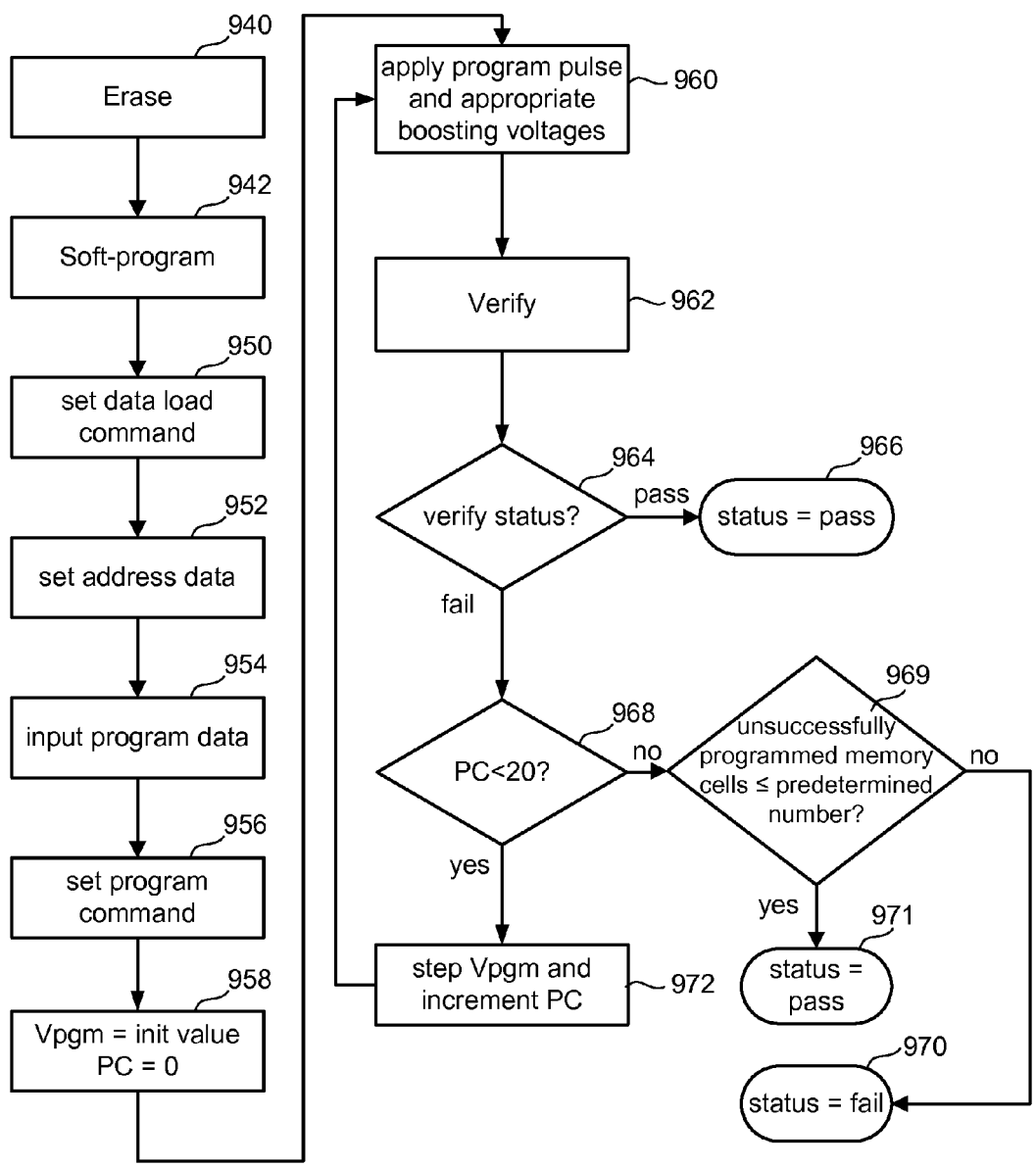
FIG. 9B is a flow chart describing one embodiment of a process for programming non-volatile memory.

FIG. 9B is a flow chart describing a programming process for programming memory cells connected to a selected word line. In one embodiment, the process of FIG. 9B is used to program one page of data. Thus, the process of FIG. 9B can be used multiple times to program the different pages in a block being written in step 906 of process 900.

In one implementation of the process of FIG. 9B, memory cells are erased prior to programming (step 940). Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells. After a block of memory cells is erased, the various memory cells can be programmed or partially programmed as described herein. Note that the erasing that is performed in step 940 would not need to be performed before each word line of a block is programmed. Rather, the block can be erased and then each word line can be programmed without erasing between the programming of the word lines.

At step 942, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 950, a "data load" command is issued by controller 244 and input to state machine 222. At step 952, address data designating the page address is provided to the decoder 224. At step 954, a page of program data for the addressed page is input for programming. For example, 528 bytes of data could be input in one embodiment. That data is latched in the appropriate registers/latches for the selected bit lines. In some embodiments, the data is also latched in a second register for the selected bit lines to be used for verify operations. At step 956, a "program" command is received from controller 244 and provided to state machine 222.

Triggered by the "program" command, the data latched in step 954 will be programmed into the selected memory cells controlled by state machine 222 using the pulses applied to the appropriate word line. At step 958, a programming signal, "Vpgm," (e.g., a series of voltage pulses) is initialized to the starting magnitude (e.g., ~12V or another suitable level) and a program counter PC maintained by state machine 222 is initialized at 0. At step 960, a pulse of the programming signal Vpgm is applied to the selected word line. The unselected word lines receive one or more boosting voltages, referred to as "Vpass". If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming. Note that the programming signal includes a set of voltage pulses, where the magnitude of the pulses increase with each successive pulse. In between voltage pulses are a set of verify pulses.

At step 962, the states of the selected memory cells are verified using the appropriate set of target levels, as discussed above. If it is detected that the threshold voltage of a selected cell has reached the appropriate target level, then the data stored in the corresponding data latch is changed to a logic "1." If it is detected that the threshold voltage has not reached the appropriate target level, the data stored in the corresponding data latch is not changed. In this manner, a bit line having a logic "1" stored in its corresponding data latch does not need to be programmed. When all of the data latches are storing logic "1," the state machine 222 knows that all selected cells have been programmed. At step 964, it is checked whether all of the data latches are storing logic "1." If so, the programming process is complete and successful because all selected memory cells were programmed and verified to their target states. A status of "PASS" is reported at step 966. Note that in some implementations, at step 964 it is checked whether at least a predetermined number of data latches are storing a logic "1." This predetermined number can be less than the number of all data latches, thereby allowing the programming process to stop before all memory cells have reached their appropriate verify levels. The memory cells that are not successfully programmed can be corrected using error correction during the read process.

If, at step 964, it is determined that not all of the data latches are storing logic "1," then the programming process continues. At step 968, the program counter PC is checked against a program limit value. One example of a program limit value is 20; however, other values can be used in various implementations. If the program counter PC is not less than the program limit value, then it is determined at step 969 whether the number of memory cells that have not been successfully programmed is equal to or less than a predetermined number. If the number of unsuccessfully programmed memory cells is equal to or less than the predetermined number, then the programming process is flagged as passed and a status of PASS is reported at step 971. In many cases, the memory cells that are not successfully programmed can be corrected using error correction during the read process. If however, the number of unsuccessfully programmed memory cells is greater than the predetermined number, the program process is flagged as failed and a status of FAIL is reported at step 970. If in step 968 it is determined that the program counter PC is less than the program limit value (e.g., 20), then the magnitude of the next Vpgm voltage pulse is increased by the step size (e.g., 0.2-0.4 volt step size) and the program counter PC is incremented at step 972. After step 972, the process loops back to step 960 to apply the next Vpgm voltage pulse.

In general, during verify operations (such as the verify operations performed during step 962 of FIG. 9B) and read operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not.

FIG. 10A is a flowchart depicting one embodiment of a process 1000 of determining whether there is a data integrity problem with a block. Process 1000 can be used to perform step 806 of FIG. 8. Process 1000 can also be used for embodiments of the refresh procedure of step 810 in which a determination is made as to whether a candidate block has a data integrity problem. In step 1002, a high resolution scan is performed of non-volatile storage elements. The scan may be performed over a limited range. For example, referring to FIG. 6B, the scan may be performed over a portion of states 14 and 15. The high resolution scan involves performing a number of reads at a higher resolution than a normal read process. Only a single word line (or portion thereof) in a block needs to be scanned to collect all of the data for detecting a data integrity problem. However, data from multiple word lines can be scanned if desired. Herein, the high resolution read points are referred to as "soft reads".

Figure 11:
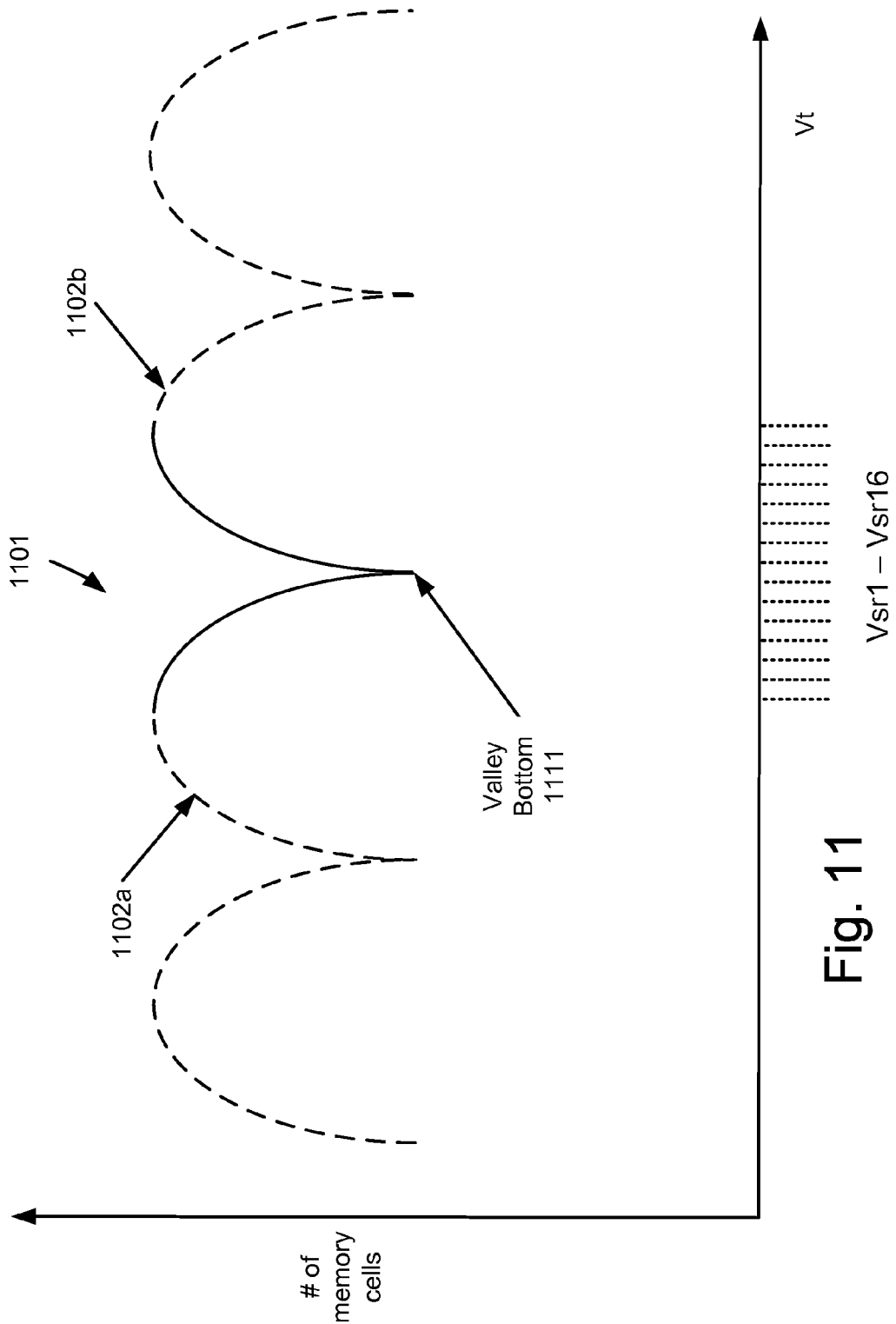
FIG. 11 depicts an example distribution function.

FIG. 11 depicts a distribution function 1101 (cell count as a function of control gate voltage). The distribution 1101 corresponds to approximately four of, for example, 16 Vt distributions such as those depicted in FIG. 6B. The distribution has "valleys" between peaks that correspond to the Vt distributions that result from programming the memory cells to different states. In one embodiment, one of the valley bottoms 1111 in the distribution function 1101 is determined. Since only the threshold voltage corresponding to one valley bottom needs to be determined, only a portion of the distribution function 1101 needs to be determined. In this example depicted in FIG. 11, 16 different control gate voltages (soft read voltages Vsr1-Vsr16) were used to produce the portion of the distribution 1101 indicated by the solid line. More or fewer than 16 soft read voltages can be used. The dashed-line portion of the distribution 1101 shows how the distribution 1101 might appear if a greater range of control gate voltages were applied.

In one embodiment, the valley that is targeted for identification is determined based on expected characteristics of Vt distributions that result from programming to various states. For example, the valley may be selected based on factors such as the expected separation between the Vt distributions and the amount of shift that is expected to occur to the different Vt distributions. With some non-volatile storage devices, the Vt distributions with higher voltages have greater separation and are expected to experience a larger shift. However, note that each state may be impacted differently by different data integrity problems, which will also impact the decision of which valley to identify. For example, state 15 may suffer from read disturb to a greater extent than other states. Therefore, if the intent is to measure for a data retention problem it may be desirable to avoid reading a state that suffers greatly from read disturb, or at least factor in how read disturb will affect the shift in the Vt distribution. Note that the high resolution scan is performed over a very limited voltage range that does not include any of the other 14 Vt distributions (in an embodiment using 16 data states). Therefore, the total number of read operations is kept to a reasonably low number. On the other hand, selecting to scan for the valley between states 14 and 15 (i.e., the highest valley when there are 16 states) may be desirable for the following reason. It may be that there is so much downward shift in the distributions that the valley betweens states 14 and 15 might be erroneously interpreted as the valley between states 13 and 14. Searching for the valley between the two highest states alleviates this problem.

To determine the distribution, the soft read voltages Vsr1-Vs16 are successively applied to control gates of memory cells of the selected word line in the block. For example, the voltage that is applied to the control gates of the memory cells is stepped up by, for example, 50 mV with each successive voltage. The number of memory cells that conduct (turn on) in response to each soft read is recorded. It is not required that the actual data stored in each given cell be recorded. Rather, the shape of the distributions 1101 can be determined based on analysis of how many memory cells conduct (turn on) in response to each of the soft read voltages.

In step 1004 of process 1000, a valley bottom in the distribution function is determined. In one embodiment a valley bottom voltage is identified. The purpose of the valley bottom voltage is to have a reference point to determine how much at least one of the Vt distributions has shifted. An example valley bottom voltage 1111 is depicted in FIG. 11 between Vt distributions 1102a and 1102b. In one embodiment, the reference point is somewhere other than the valley bottom. For example, the reference voltage could be a peak in the distribution function 1101.

In one embodiment, the valley is determined by first smoothing the threshold voltage distribution data. Any one of many suitable known functions can be used to smooth the threshold voltage distribution data. For example, a low pass filter can be used to smooth the data. Then, a derivative of the smoothed data may be determined. There are many ways and forms to create and store information about the derivative, with no one particular way or form required. Next, the output of the derivative calculation is investigated to look for a zero crossing to identify the valley.

The following describes another technique for finding a valley. In this embodiment, the threshold voltage distribution data is smoothed by convolving the threshold voltage distribution data with a function. In one embodiment, the function is a Gaussian function. In another embodiment, the function is a truncated Gaussian so that the front and back tails of the Gaussian function are removed. In other embodiments, functions other than a Gaussian can be used. Then, the derivative of the smoothed data is determined. Next, the output of derivative calculation is investigated to look for a negative to positive transitioning zero crossing in order to identify the valley.

One additional technique that can be used to locate the valley is to square the threshold voltage distribution data. This may serve to provide more contrast for the data. Then, the square of threshold voltage distribution data is smoothed using any of the methods discussed above. Next, the derivative of the smoothed data is determined and the valley is determined from a zero crossing.

In step 1006, a shift in Vt distribution is determined based on the reference point (e.g., threshold voltage of valley bottom voltage). As another example, a shift in Vt distribution 1102b can be determined based on threshold voltage of a peak in the distribution function. In one embodiment, the derivative techniques described above can be modified to identify a peak in the distribution function 1101. In one embodiment, the shift in Vt distribution is calculated as the difference between the valley bottom voltage and a reference voltage. The reference voltage can be determined based on the expected shape of Vt distribution 1102b after programming. The expected shape can be determined by engineering characterization. Thus, the shape of the Vt distributions 1102a and 1102b immediately after programming in the field need not be determined in order to determine the reference voltage. Also note that when first programmed, the Vt distributions 1102a, 1102b may not overlap at all. Note that the distributions 1102a, 1102b can shift either to the right or to the left as a result of data retention problems depending on whether charge was removed or added to the cells during programming.

In step 1008, a determination is made as to whether to refresh the data based, at least in part, on the shift in Vt distribution. The amount of shift that warrants a data refresh can be determined based on laboratory tests that determine how those shifts affect the ability to accurately read data. If the data in the block are to be refreshed, then process 900 of FIG. 9A is performed. However, the data refresh does not need to be performed immediately. For example, the data refresh can be deferred until a determination is made as to which blocks in the entire memory array 200 are to be refreshed. A record of the blocks to be refreshed is kept such that the data refresh (e.g., process 900) may be performed at a convenient time. In some cases, the data refresh will not be performed prior to the device 210 being powered down. Therefore, the record should be maintained in non-volatile memory such as a spare block.

The refresh determination of step 1008 can be based on many factors other than, or in addition to, Vt distribution shift. Note that states in which the memory cells have higher threshold voltages may lose/gain charge at a faster rate than states associated with lower threshold voltages. Thus, one factor in the refresh determination is which states are associated with the Vt distributions under analysis. As previously discussed, various states may have different widths/spacings in order to accommodate varying amounts of susceptibility to data retention loss. Thus, states that are more prone to shift may be better suited for measuring the shift in Vt distribution. However, any of the states can be used to measure the shift in Vt distribution. The different Vt distribution shift characteristics for a particular storage device can be learned based on tests that are performed on the device in a laboratory.

Another factor to be considered in the refresh determination is which word line or word lines were tested for data integrity. As previously discussed, in one embodiment, a single word line is selected for testing for a data integrity problem. Different word lines may have different characteristics with respect to certain data integrity problems such as data retention. Note that because the characteristics of some word lines will be very similar to others, different word lines may be grouped into a set.

Still another factor to be considered is the number of times that the block has been programmed, which is otherwise referred to as a "hot count." The hot count may be stored as overhead in the block. Blocks that have been programmed many times may tend to move towards charge neutrality more rapidly than those programmed only a few times. Therefore, a block with a high hot count possibly should be refreshed with a smaller shift in Vt distribution than a block with a low hot count, at least for some storage devices.

Another factor is the time that has elapsed since the block was programmed. However, because the device may be subjected to extreme differences in environmental conditions, the time since last write may not by itself be a reliable indicator of the need to refresh data. That is, overreliance on the time since the last programming may lead to failing to refresh when needed if the time parameter is too long or refreshing too often if the time parameter is too short. However, as one factor among many, using a time parameter may be beneficial when deciding whether to refresh data in a borderline case.

Another factor to consider is the present power supply voltage, which can affect the magnitude of many of the voltages such as the magnitude of the soft read voltages that are used to determine a point at which the Vt distributions intersect.

The refresh decision can also be based on the temperature when the selected block was programmed and the current temperature. Note that the threshold voltage of a transistor is a function of temperature. Therefore, if these two temperatures are substantially different, a shift in Vt distribution can be expected. In one embodiment, the storage device 210 has built in temperature compensation to account for such temperature induced shifts in threshold voltage in which case it may not be necessary to factor in temperate when making the refresh determination.

In one embodiment, the storage device 210 stores a multi-axis "refresh factors" table that specifies how the foregoing factors affect the refresh determination. The refresh factors table may be stored in the memory array 200 prior to providing the storage device 210 to the customer such that the table is accessible to the managing circuit. FIG. 12 depicts an example of a two-axis table 1200 having a first axis for 16 different states (S0-S15) and a second axis for five different groups of word lines (WL). In practice, each cell contains a value used to determine how much the Vt distribution is allowed to shift for the factors associated with the cell. For example, the cell associated with state 13 and WL11-WL23 has the value "Vx". Values are not depicted in other cells of the example table 1200 so as to not obscure the diagram.

As a particular example, if word line 17 was tested and state 13 is being analyzed, then referring to table 1200 the shift in the Vt distribution is compared to the value "Vx" to determine whether there is a data integrity problem. The table 1200 may have many more axes, with each axis corresponding to one of the foregoing factors, or other factors. For example, the table 1200 could have another axis corresponding to different hot count ranges.

FIG. 10B depicts one embodiment of a process 1030 of determining whether a data refresh is needed based on how many bits need to be corrected by a correction algorithm. Process 1030 is one technique for performing step 806 of FIG. 8. In step 1032, cells in the selected word line are read. As previously discussed, in one embodiment, the word line is randomly selected.

In step 1034, an ECC algorithm is executed on the data just read in. The ECC algorithm determines how many bits of the data need correction.

In step 1038, the controller 244 determines whether the number of bits that are in need of correction is greater than a threshold number of bits. If so, then the block is identified as in need of a data refresh and a refresh procedure (e.g., FIG. 9A) is performed at this time or later. If the number of bits in error is less than the threshold, then the block is not identified for data refresh at this time (step 1042). In one embodiment, the threshold is a function of the hot count. For example, the higher the hot count, then lower the threshold.

FIG. 10C depicts one embodiment of a process 1060 of determining whether a data refresh is needed based on how long a correction algorithm takes to converge. Process 1060 is one technique for performing step 806 of FIG. 8. In step 1062, cells in the selected word line are read.

In step 1064, the controller 244 performs an ECC algorithm to attempt to recover data bits that are in error. In step 1068, the controller 244 determines whether the correction algorithm took longer to converge than is permitted. In one embodiment, the controller 244 determines whether an iterative decoding technique took more than an allowed number of iterations to converge. The allowed number can be a variable that can be adjusted to change the sensitivity of the process 1060. For example, if the block is a candidate block identified in step 808 of process 800, then the sensitivity could be increased. If the correction algorithm takes too long to converge, then the block is refreshed either at this time or later (step 902). If the correction algorithm converges within the allowed number of iterations, then the data in the block is not refreshed (step 1072). In one embodiment, the number of iterations is a function of the hot count. For example, for a higher the hot count, the allowed number of iterations to converge is lower.

Figure 13A:
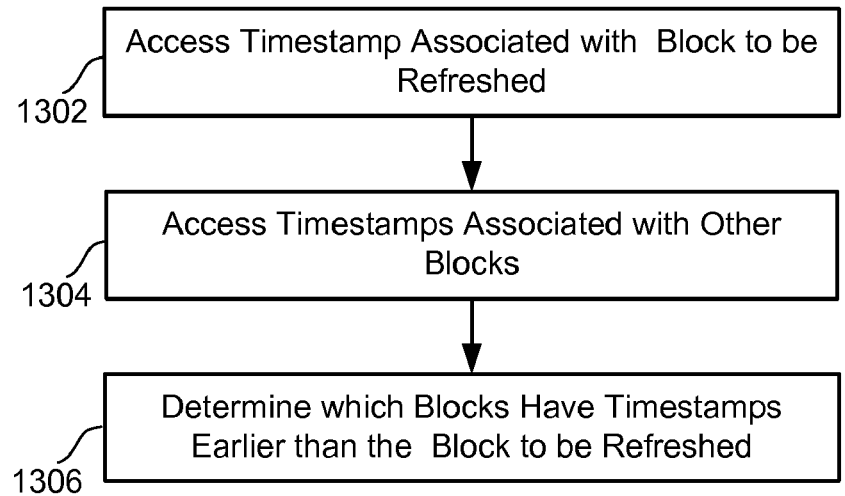
FIG. 13A depicts one embodiment of a process of identifying candidate blocks for a refresh procedure.

FIG. 13A depicts one embodiment of a process 1300 of identifying candidate blocks for a refresh procedure. The process of FIG. 13A may be used to implement step 808 of FIG. 8. Process 1300 uses time stamps associated with each block to identify candidate blocks. In step 1302, a time stamp that is associated with the bad block is accessed. (The bad block was identified in step 806 of process 800.) In step 1304, time stamps that are associated with other blocks are accessed. In one embodiment, the time stamp for a block is stored in the block itself. Typically, each word line has some memory cells that are not used for data storage. The time stamp may be stored in storage elements associated with one of those unused memory cells. If the time stamps are stored in each block, only the word line having the time stamp needs to be read. Also, note that most of the data in the word line can be ignored since the time stamp data will be only a very small portion of the data in the word line. In one embodiment, a "time stamp" table in the storage device stores the time stamps alleviating the need to read the time stamps from each block. For example, one or more blocks in the memory array 200 are set aside for the time stamp table.

In step 1306, a determination is made as to which blocks have time stamps that are earlier than the time stamp associated with the bad block. Those blocks are identified as candidate blocks for a refresh procedure. In one embodiment, blocks that were last programmed within a certain time after the block with a data integrity problem are also marked for the refresh procedure. For example, those blocks that were last programmed a day or two after the bad block may also suffer from the same environmentally caused data integrity problems, and therefore be identified as candidate blocks. For those blocks identified as candidate blocks, step 810 of process 800 is performed.

Figure 13B:
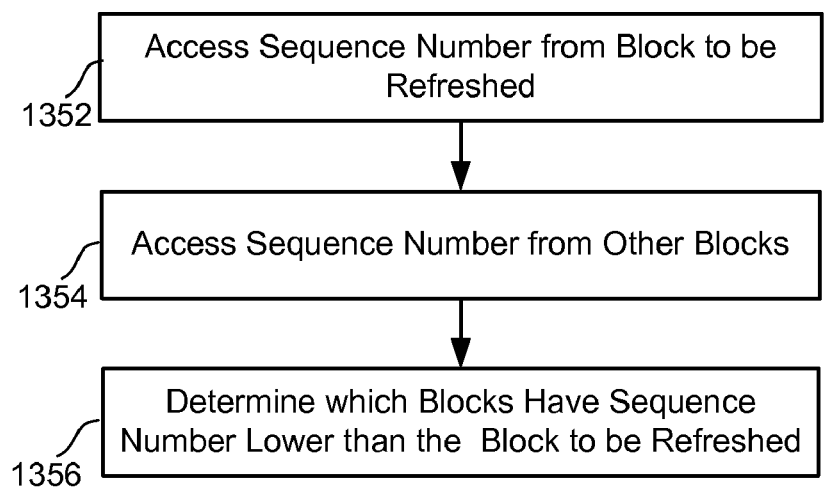
FIG. 13B is a flowchart depicting one embodiment of a process for identifying candidate blocks for a refresh procedure.

In one embodiment, sequence numbers are associated with each block rather than time stamps. The sequence numbers describe the order in which the blocks were programmed. FIG. 13B is a flowchart depicting one embodiment of a process 1350 for identifying candidate blocks for a refresh procedure by using sequence numbers. The process 1350 of FIG. 13B may be used to implement step 808 of FIG. 8. In step 1352, a sequence number that is associated with the bad block is accessed. In step 1354, sequence numbers that are associated with other blocks are accessed. Typically, the sequence numbers for a block is stored in that block. However, the sequence numbers could be stored elsewhere such as in a spare block that has a table of sequence numbers associated with block numbers.

In step 1356, the blocks that have sequence numbers that are lower than the sequence number associated with the bad block are identified as candidates for the refresh procedure. For those blocks identified as candidate blocks, step 810 of process 800 is performed.

FIG. 14 depicts one embodiment of a process 1400 of managing sequence numbers that are used to identify candidate blocks for a refresh procedure. In step 1402, the storage device 210 is powered on. Note that the storage device 210 may be integrated into another device, such as a personal navigation device. Using this example, the storage device 210 may have power whenever a power source is available to the personal navigation device. For example, the user might plug the personal navigation device into a power source such as an automobile's "electric lighter." In this example, the storage device 210 may be powered on by the user plugging the device into the lighter even if the user has the personal navigation device switched off.

In step 1404, a sequence number is read from blocks of the memory array 200. Some blocks may not have a sequence number. For example, blocks that do not currently store valid data will not have a sequence number. In one embodiment, blocks that only store a single bit per cell do not have a sequence number as they do not require testing. Note that there may be many other actions performed after the storage device 210 is powered on prior to reading the sequence numbers.

In step 1406, the highest sequence number is recorded as the current sequence number. The current sequence number may be recorded in random access memory, which may be either on the storage device 210 or external to the device 210. For example, the host coupled to the device 210 may have random access memory available. Alternatively, the current sequence number may be recorded in non-volatile memory (e.g., a spare block).

In step 1408, a request is received to write one or more blocks to the memory array 200. In step 1410, the current sequence number is incremented. In step 1412, the current sequence number (after the incrementing) is stored in the block that is being written. If there are more blocks to be written (step 1414), then control passes to step 1410 to increment the sequence number and store it in the next block being written.

FIG. 15 depicts one embodiment of a process 1500 of managing time stamps that are used to select candidate blocks for a refresh procedure (e.g., step 810 of process 800). The process 1500 begins in step 1502 with the storage device 210 being powered on.

In step 1504, time stamps are read from different blocks. As with the embodiment that uses sequence numbers, not all blocks will have time stamps. As previously discussed, in one embodiment of step 1304 of process 1300 the time stamps are accessed from a table. In optional step 1506, the time stamps read in step 1504 are stored in that time stamp table. The table may be in RAM or the table may occupy one or more blocks of non-volatile storage.

In step 1508, a request is received to write one or more blocks. In step 1510, the current time is determined. Note that in some cases the accuracy of the time that is available may be questionable. For example, the time might be accessed by querying a host that is coupled to the storage device 210. However, the host might provide an inaccurate time. For example, the host's clock might have been programmed incorrectly. The accuracy of the time can be questioned based on the type of source (e.g., personal computers not to be trusted) or based on the time being inconsistent with a previous time (e.g., time moving backwards). If the time information is not trusted, a dummy value can be used in place of the time information. As an alternative, the last trusted time information can be stored instead. Note that if the last trusted time information is stored this might lead to a conclusion that a block was programmed prior to when it actually was. Thus, process 1300, which determines when to refresh based on when blocks were programmed, might be over inclusive.

In some embodiments, the storage device 210 has access to a time source that is trusted as being very reliable. For example, if the storage device 210 is used in a personal navigation device that receives the correct time from a satellite, then the time can be considered trusted as accurate.

In step 1512, the time stamp is stored in the block(s) being written. If desired, step 1510 can be repeated for each block being written. However, so long as the writing process is not interrupted for a substantial period of time, the same time stamp can be used for all of the blocks being written in a given write request. In optional step 1514, the time stamp table is updated.

Note that both time stamps and sequence numbers can be stored for the blocks. As previously discussed, if the time information is not trusted, the time stamp that is stored may be a dummy value. When performing process 1300 to determine whether to refresh based on the time stamps, for those blocks having a dummy value the sequence numbers can be used instead for the refresh determination.

Figure 16:
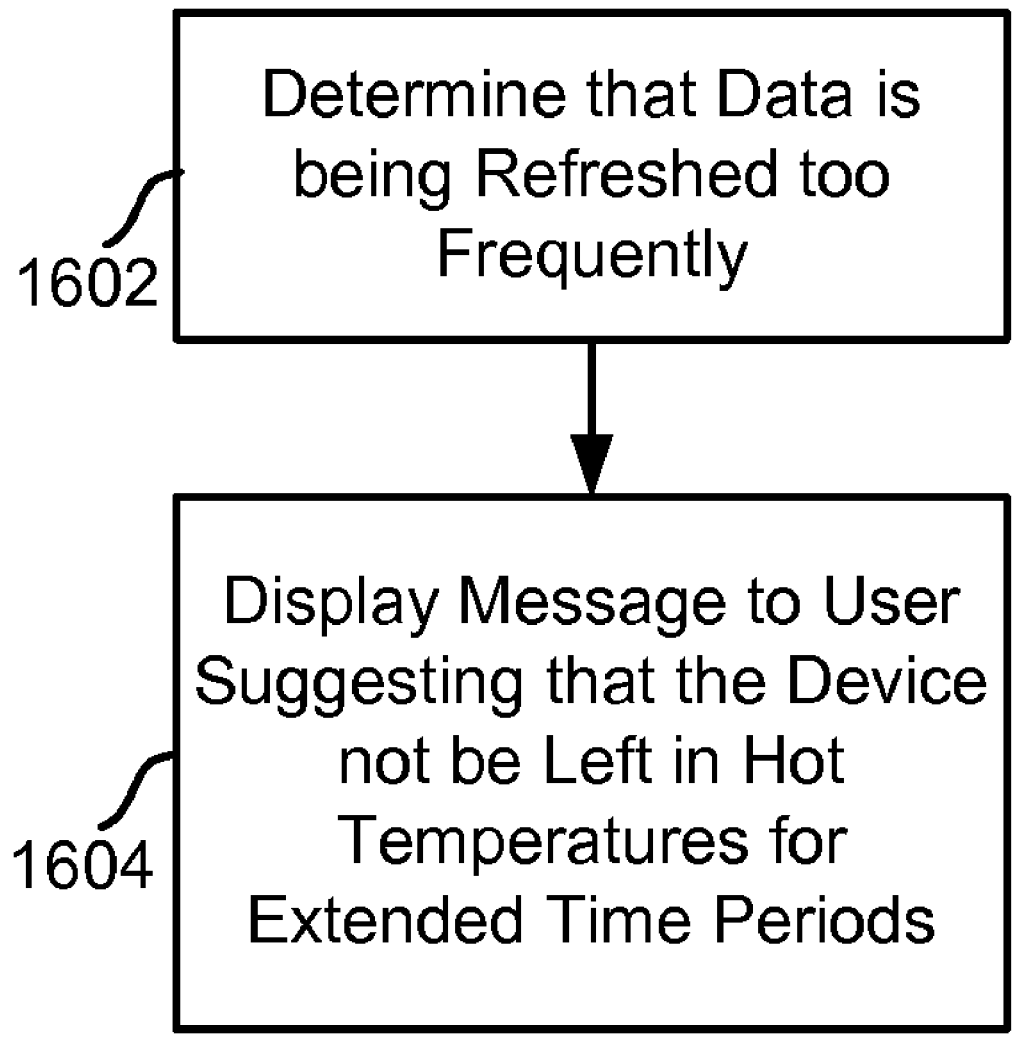
FIG. 16 depicts one embodiment of a process of warning a user to take action intended to mitigate data retention problem.

FIG. 16 depicts one embodiment of a process 1600 of warning a user to take action intended to mitigate data retention problems. In step 1602, it is determined that the storage device 210 is being refreshed too frequently. In one embodiment, the managing circuits make this determination, but the determination could be made external to the storage device 210.

To determine whether data is being refreshed too frequently, a record pertaining to data refreshes may be maintained. The record could track each time process 800 resulted in refreshing at least one block. The record can also include how many total blocks were refreshed, how many were refreshed based on determination of an actual data integrity problem (as determined, for example, by one or more of processes 1000, 1030, or 1060), based on automatically refreshing based on when programmed, etc.

The record can also indicate when the refresh occurred, if time information is available. In some cases, the time of a particular data refresh will not be known, but a time window can determined. For example, when the data refresh occurs the storage device might be coupled to a host that does not provide the correct or trusted time. However, if the storage device is later coupled to a host that provides the time, the time of refresh can be localized to a time window (assuming a time prior to the refresh is known). The determination of how many data refreshes over a period of time is considered too frequent can be determined based on information learned when the device was qualified in the laboratory.

In step 1604, a message is displayed warning the user to take corrective action to mitigate the data integrity problems. As an example, the message indicates that the user should not leave the storage device for extended time periods in an environment having high temperatures.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device comprising:
a plurality of groups of non-volatile storage elements, including a first group and a second group; and
one or more managing circuits in communication with the plurality of groups of non-volatile storage elements, the one or more managing circuits determine that a refresh of data stored in the first group of non-volatile storage elements should be performed based on a condition of one or more of the non-volatile storage elements in the first group, the one or more managing circuits determine whether the second group of non-volatile storage elements should undergo a refresh procedure based on when the second group of non-volatile storage elements were last programmed relative to when the first group of non-volatile storage elements were last programmed, the managing circuit performs the refresh procedure on the second group.

2. The non-volatile storage device of claim 1, wherein the one or more managing circuits determine whether to refresh data stored in the second group of non-volatile storage elements based on a condition of one or more non-volatile storage elements in the second group.

3. The non-volatile storage device of claim 1, wherein the one or more managing circuits determine to refresh data stored in the second group of non-volatile storage elements without determining whether a data integrity problem exists in the second group of non-volatile storage elements.

4. The non-volatile storage device of claim 1, wherein the one or more managing circuits determine whether the second group of non-volatile storage elements should undergo the refresh procedure based on whether the second group was last programmed prior to when the first group was last programmed.

5. The non-volatile storage device of claim 1, wherein the one or more managing circuits access a first time stamp associated with the first group of non-volatile storage elements, the first time stamp indicates when the first group of non-volatile storage elements was last programmed, the one or more managing circuits access time stamps associated with blocks of non-volatile storage elements in the device, the time stamps indicate when each of the blocks of non-volatile storage elements was last programmed, the one or more managing circuits refresh data stored in blocks having a time stamp that is earlier than the first time stamp.

6. The non-volatile storage device of claim 1, wherein the one or more managing circuits access a sequence number for each of a plurality of groups of non-volatile storage elements in the device, the sequence numbers indicate the order in which the plurality of groups were programmed, the sequence numbers include a first sequence number for the first group, the one or more managing circuits refresh data stored in groups of the plurality of groups that have a sequence number that is lower than the first sequence number.

7. The non-volatile storage device of claim 1, wherein the one or more managing circuits program the first group to a plurality of threshold voltage distributions that includes a first threshold voltage distribution and a second threshold voltage distribution, the one or more managing circuits determine a threshold distribution of the first group of non-volatile memory cells, the one or more managing circuits determine a valley in the threshold distribution, the one or more managing circuits determine whether the refresh of data stored in the first group of non-volatile storage elements should be performed based on a shift in the valley.

8. The non-volatile storage device of claim 7, wherein the one or more managing circuits determine the valley by applying a plurality of read reference voltages to at least a portion of the non-volatile storage elements in the first group, the one or more managing circuits apply the read reference voltages over a voltage range that includes a portion of the first threshold voltage distribution and the second threshold voltage distribution.

9. The non-volatile storage device of claim 8, wherein the first group of non-volatile storage elements is associated with a plurality of word lines, the one or more managing circuits randomly select a first word line of the word lines to apply the plurality of read reference voltages to.

10. The non-volatile storage device of claim 9, wherein the one or more managing circuits determine that a refresh of data stored in the first group of non-volatile storage elements should be performed based, at least in part, on the position of the first word line relative to the position of the other word lines.

11. The non-volatile storage device of claim 10, wherein the one or more managing circuits determine that a refresh of data stored in the first group of non-volatile storage elements should be performed based further, at least in part, on the number of times the one or more non-volatile storage elements in the first group have been programmed.

12. The non-volatile storage device of claim 11, wherein the one or more managing circuits determine that a refresh of data stored in the first group of non-volatile storage elements should be performed based further, at least in part, on a temperature when the one or more non-volatile storage elements in the first group were programmed and a current temperature.

13. A portable electronic device comprising:
a plurality of groups of non-volatile storage elements; and
one or more managing circuits in communication with the plurality of groups of non-volatile storage elements, the one or more managing circuits program the plurality of groups of non-volatile storage elements to each store data as a plurality of bits, the one or more managing circuits determine whether data stored in a first group of the plurality of groups should be refreshed based on a condition of one or more non-volatile storage elements in the first group, determines which groups of non-volatile storage elements in the plurality of groups were written prior to the first group of non-volatile storage elements in response to determining that data stored in the first group should be refreshed, the one or more managing circuits determine that the groups of non-volatile storage elements that were written prior to the first group should undergo a data refresh procedure.

14. A portable electronic device of claim 13, wherein the one or more managing circuits perform the data refresh procedure, the one or more managing circuits determine which of the groups of non-volatile storage elements that were written prior to the first group have at least one non-volatile storage element with a data integrity problem and the one or more managing circuits refresh data in the groups with at least one non-volatile storage element with a data integrity problem.

15. A portable electronic device of claim 13, wherein the one or more managing circuits determine which groups of non-volatile storage elements of the plurality of groups were written a certain amount of time after the first group of non-volatile storage elements, the one or more managing circuits determine that the groups of non-volatile storage elements that were written the certain amount of time after the first group should not have data refreshed in response to determining that data stored in the first group should be refreshed.

16. A portable electronic device of claim 15, further comprising:
a user interface in communication with the plurality of groups of non-volatile storage elements and in communication with the one or more managing circuits, the user interface displays data stored in the plurality of groups of non-volatile storage elements;
wherein the one or more managing circuits determine that data stored in the plurality of groups of non-volatile storage elements is being refreshed more frequently than permitted, the one or more managing circuits indicate that a message should be displayed on the user interface to suggest a change in how the device is exposed to environmental conditions.

17. A portable electronic device of claim 16, wherein the message suggests that the device not be exposed to high temperatures for extended time periods.

18. A portable electronic device of claim 16, further comprising:
a communication circuit in communication with the one or more managing circuits, the communication circuit receives time information from a satellite, the one or more managing circuits store the time information to track when each of the plurality of groups of non-volatile storage elements were last programmed.

19. A non-volatile storage device comprising:
a plurality of blocks of non-volatile storage elements; and
the one or more managing circuits in communication with the plurality of blocks of non-volatile storage elements, the one or more managing circuits determine whether there is a data integrity problem with one or more non-volatile storage elements in a first block of the blocks, the one or more managing circuits determine which of the blocks were written prior to the first block in response to determining that there is a data integrity problem with the first block, the one or more managing circuits refresh data stored in the first block and the blocks that were written prior to the first block in response to determining that there is a data integrity problem with the first block, the one or more managing circuits refresh the data without determining whether there is a data integrity problem with non-volatile storage elements in the blocks that were written prior to the first block.

20. A non-volatile storage device of claim 19, wherein to determine whether there is a data integrity problem with the first block the one or more managing circuits determine whether a shift in at least one threshold voltage distribution of the one or more non-volatile storage elements in the first block is greater than an allowed shift.

21. A non-volatile storage device of claim 19, wherein the one or more managing circuits program each non-volatile storage element in the first block to store a plurality of data bits and the one or more managing circuits determines that the number of data bits in the first block that need to be corrected by an error correction algorithm is greater than a threshold in order to determine that there is a data integrity problem.

22. A non-volatile storage device of claim 19, wherein the one or more managing circuits determine whether there is a data retention problem with the one or more non-volatile storage elements in the first block as a part of determining whether there is a data integrity problem with the first block.

23. A non-volatile storage device of claim 22, wherein, as a part of determining whether there is a data retention problem, the one or more managing circuits measure a shift in a valley of a threshold distribution of the non-volatile storage elements in the first block, the shift reflects the data retention problem.

24. A non-volatile storage device of claim 23, wherein the one or more managing circuits apply a plurality of read reference voltages to at least a portion of the non-volatile storage elements in the first block, the read reference voltages are applied over a voltage range that includes a portion of a first threshold voltage distribution and a second threshold voltage distribution that overlap, the one or more managing circuits determine the threshold distribution of the non-volatile storage elements based on the read reference voltages, the one or more managing circuits determine the shift in the valley.

25. A non-volatile storage device of claim 24, wherein the one or more managing circuits determine whether there is a data integrity problem by determining whether the intersect voltage has shifted by more than an allowed amount for the first threshold voltage distribution and the second threshold voltage distribution.

* * * * *